(12) United States Patent
Gao

(10) Patent No.: US 11,822,397 B2
(45) Date of Patent: Nov. 21, 2023

(54) SERVER RACK LIQUID DISTRIBUTION WITH REDUNDANCY

(71) Applicant: Baidu USA LLC, Sunnyvale, CA (US)

(72) Inventor: Tianyi Gao, Sunnyvale, CA (US)

(73) Assignee: BAIDU USA LLC, Sunnyvale, CA (US)

(*) Notice: Subject to any disclaimer, the term of this patent is extended or adjusted under 35 U.S.C. 154(b) by 138 days.

(21) Appl. No.: 17/376,661

(22) Filed: Jul. 15, 2021

(65) Prior Publication Data
US 2023/0019501 A1   Jan. 19, 2023

(51) Int. Cl.
*G06F 1/20*       (2006.01)
*H05K 7/20*       (2006.01)

(52) U.S. Cl.
CPC .......... *G06F 1/20* (2013.01); *H05K 7/20836* (2013.01); *G06F 2200/201* (2013.01)

(58) Field of Classification Search
CPC .......... H05K 7/20272; H05K 7/20763; H05K 7/20836; H05K 7/20663; H05K 7/203; H05K 7/20327; H05K 7/207; H05K 7/20281; H05K 7/208; H05K 7/20318; H05K 7/20627; H05K 7/20727; G05B 19/042; G06F 2200/201; G06F 1/20; G06F 1/206
See application file for complete search history.

(56) References Cited

U.S. PATENT DOCUMENTS

| | | | | |
|---|---|---|---|---|
| 6,450,254 | B1* | 9/2002 | Hoyle | G05D 7/0641 |
| | | | | 165/41 |
| 6,516,249 | B1* | 2/2003 | Hoyle | G05D 7/0688 |
| | | | | 700/282 |
| 10,617,042 | B2* | 4/2020 | Shelnutt | H05K 7/20772 |
| 2012/0022705 | A1* | 1/2012 | Ludwig | G05D 7/0694 |
| | | | | 700/282 |
| 2018/0092254 | A1* | 3/2018 | Shelnutt | H05K 7/20772 |
| 2022/0338389 | A1* | 10/2022 | Zuo | H05K 7/20781 |
| 2022/0342430 | A1* | 10/2022 | Doyle | G05D 7/0635 |

* cited by examiner

*Primary Examiner* — Darrin D Dunn
(74) *Attorney, Agent, or Firm* — WOMBLE BOND DICKINSON (US) LLP

(57) ABSTRACT

A cooling system can distribute fluid to and from IT equipment in an IT rack which can be understood as a server rack which houses multiple servers. The cooling system can include three distribution channels for the server rack. At least one of the distribution channels can be connected to valves that are arranged to operate that distribution channel in a bi-directional manner. This bi-directional distribution channel can switch operation if any of the other distribution channels becomes inoperative.

20 Claims, 7 Drawing Sheets

SERVER RACK LIQUID DISTRIBUTION WITH REDUNDANCY

FIELD

Embodiments of the present disclosure relate generally to a cooling system for an information technology (IT) rack. In particular, the cooling system can distribute fluid in the IT rack with redundant operation.

BACKGROUND

Information Technology (IT) includes technology such as computers that are accessible through the internet or a local network, which provide storage of, or access to, data, websites, computer programs, algorithms, services, and more. IT equipment such as servers and other electronic devices (e.g., peripheral devices) can be installed in a chassis. These chassis can then be installed in an IT rack. An IT rack can be populated with a plurality of chassis, each housing IT equipment, as a manner of managing power and thermal requirements of the IT equipment.

A liquid cooling system can facilitate circulation of fluid between an IT rack and the chassis, and between the chassis and the IT equipment that is mounted on the chassis. Such a system can provide high operational and cooling efficiency of the IT equipment. Liquid cooling for high power density electronics has increased in popularity because air cooling can be thermally insufficient in some circumstances. Liquid cooling allows for higher packaging density and increased computing load of electronics, by transferring greater thermal energy from the electronic equipment.

Liquid cooling systems can be susceptible to fluid leaks, which can damage IT equipment. When this occurs, the fluid distribution infrastructure may need to be replaced, which can cause undesirable downtime to the IT equipment. Further, a cooling system should accommodate different rack architectures and be expandable. A modular solution that can be integrated with the IT rack or with the facility should provide flexibility for different types of IT racks and different numbers of IT racks. Thus, there is a need for a cooling solution that addresses issues described.

BRIEF DESCRIPTION OF THE DRAWINGS

The aspects are illustrated by way of example and not by way of limitation in the figures of the accompanying drawings in which like references indicate similar elements. It should be noted that references to "an" or "one" aspect of this disclosure are not necessarily to the same aspect, and they mean at least one. Also, in the interest of conciseness and reducing the total number of figures, a given figure may be used to illustrate the features of more than one aspect, and not all elements in the figure may be required for a given aspect.

DETAILED DESCRIPTION

Figure 1:
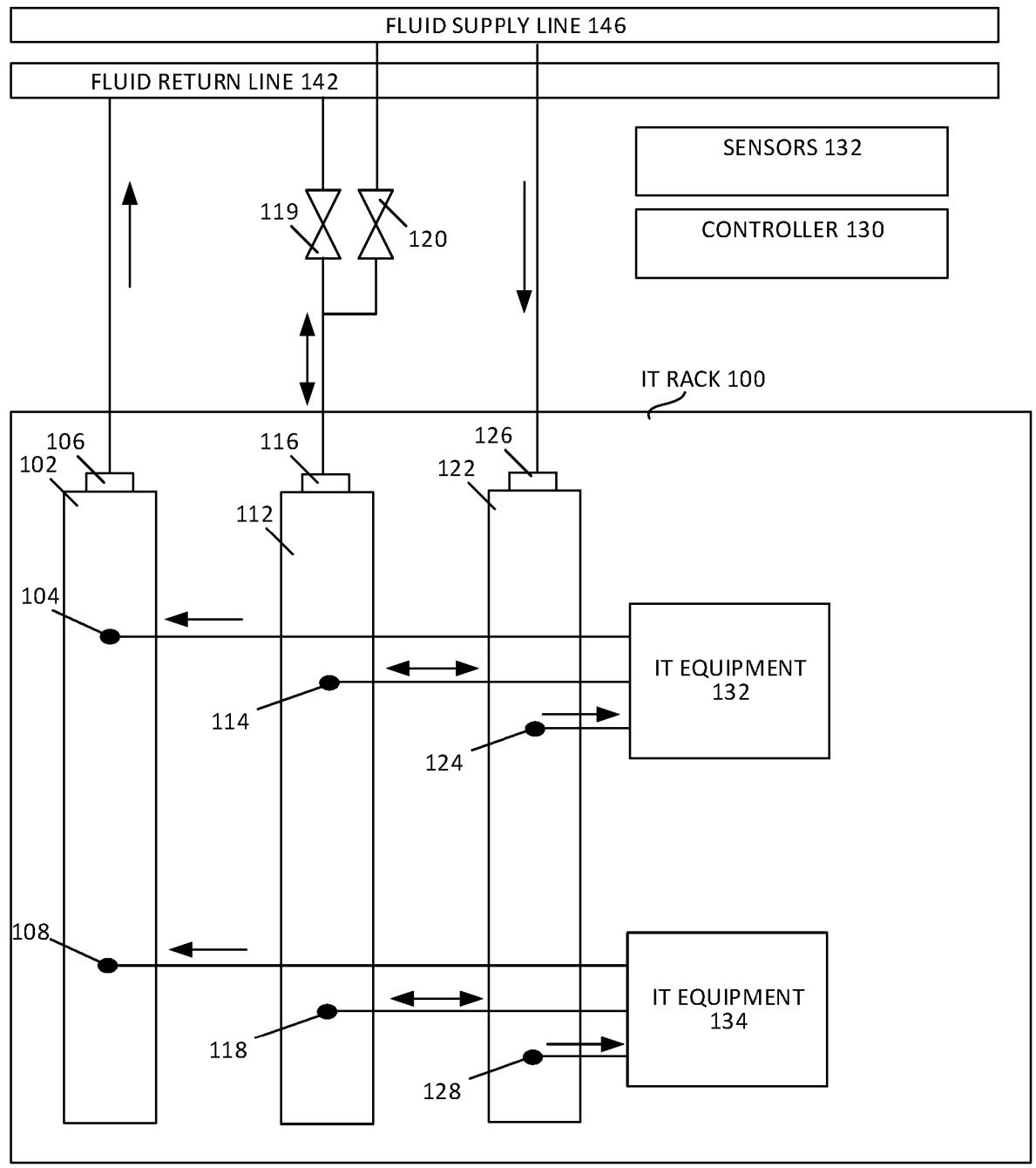
FIG. 1 shows a cooling system with a redundant fluid distribution channel for an IT rack, according to some embodiments.

Several aspects of the disclosure with reference to the appended drawings are now explained. Whenever the shapes, relative positions and other aspects of the parts described in a given aspect are not explicitly defined, the scope of the disclosure here is not limited only to the parts shown, which are meant merely for the purpose of illustration. Also, while numerous details are set forth, it is understood that some aspects may be practiced without these details. In other instances, well-known circuits, structures, and techniques have not been shown in detail so as not to obscure the understanding of this description. Furthermore, unless the meaning is clearly to the contrary, all ranges set forth herein are deemed to be inclusive of each range's endpoints.

Reference in the specification to "one embodiment" or "an embodiment" means that a particular feature, structure, or characteristic described in conjunction with the embodiment can be included in at least one embodiment of the disclosure. The appearances of the phrase "in one embodiment" in various places in the specification do not necessarily all refer to the same embodiment.

Liquid cooling systems can circulate fluid to and from IT equipment within an IT rack. An IT rack can have a fluid distribution channel for supplying fluid to IT equipment, and a fluid distribution channel for receiving fluid from IT equipment. These fluid distribution channels can be understood as a manifold. A fluid distribution channel can include a centralized channel that fluidly connects to a fluid supply line or fluid return line. Distribution ports on the fluid distribution channel can distribute the fluid to and from IT equipment in the racks. Thus, the fluid distribution channels can serve as centralized fluid distribution for the IT equipment, which can save space within an IT rack, rather than having a rat's nest of conduit and hoses. A failure to a fluid distribution channel, however, can cause unwanted downtime due to being single point failure. An operator may shut down an entire IT rack in order to replace a failed fluid distribution channel.

Aspects of the cooling system described in the present disclosure can enable operation of an IT rack with redundant operation of fluid circulation through fluid distribution channels that can stand in for each other when a failure occurs. As such, the fluid distribution channel may no longer be a single point failure. The design enables the facility to be operated continuously (e.g., 24/7), which may be required by many mission critical facilities. Efficiency of the cooling system can also be improved, according to some aspects.

In some aspects of the present disclosure, a liquid cooling system for an IT rack distributes fluid to and from IT equipment in an IT rack. The cooling system can include a first distribution channel, a second distribution channel, and a third distribution channel, each having a main port that connects to a fluid return line or a fluid supply line, and one or more distribution ports that deliver fluid or receive fluid from IT equipment housed in the IT rack. One or more valves can be connected to the distribution channels such that the first distribution channel, the second distribution channel, and/or the third distribution channel fluidly connects and disconnects with both the fluid return line and the fluid supply line through the one or more valves. The fluid distribution channels that are connected to the one or more valves serve as bi-directional distribution channels—they can supply fluid from a fluid supply line to the IT equipment and/or collect and route the return fluid from the IT equipment to the return line, depending on the state of the one or more valves. A controller can be communicatively coupled to each of the one or more valves to control a state of the one or more valves, thus determining whether the bi-directional distribution channels serve to supply or return fluid for the IT equipment.

Figure 2:
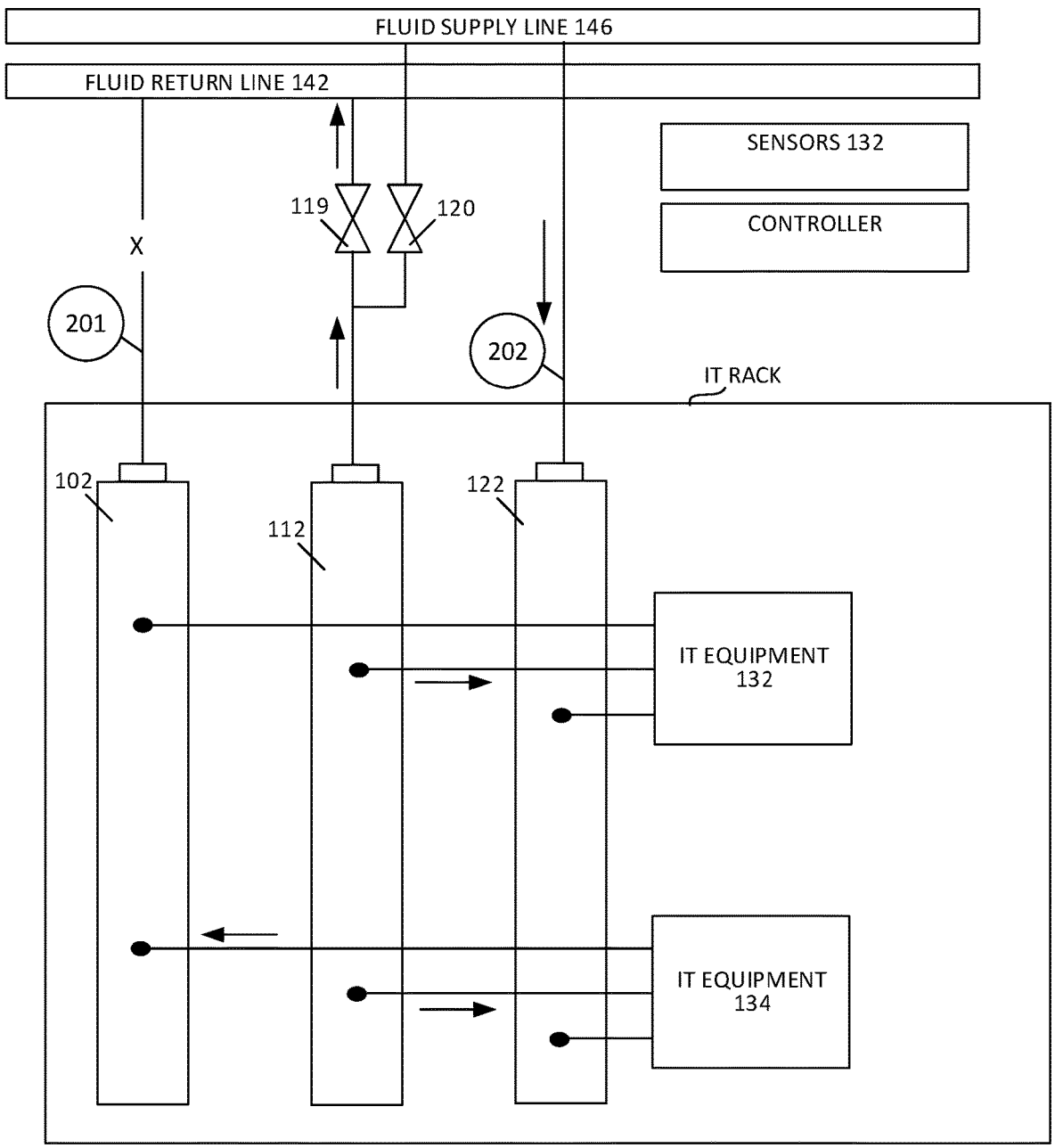
FIG. 2 shows an example of a bi-directional distribution channel serving as return distribution channel, according to some embodiments.
Figure 3:
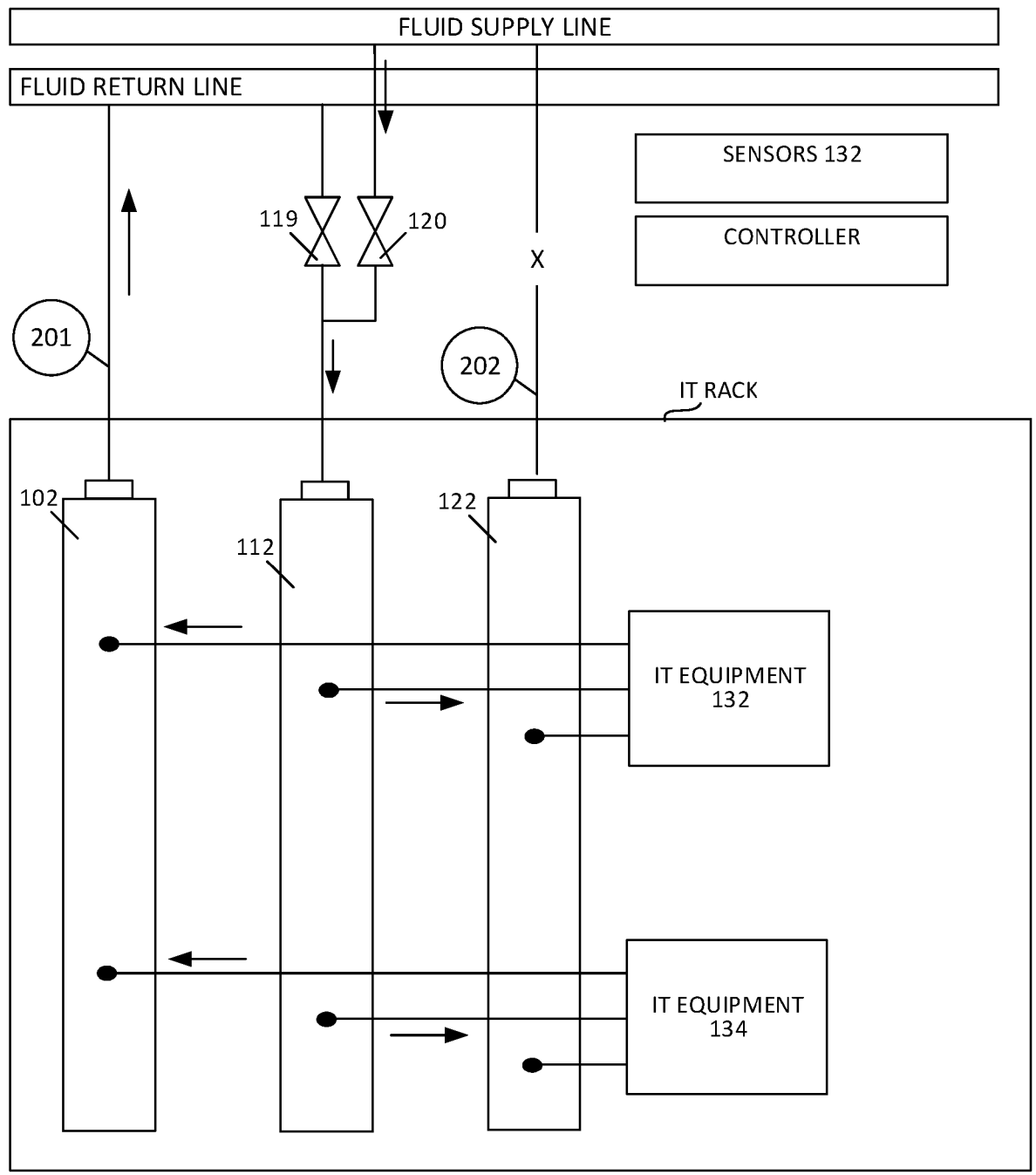
FIG. 3 shows an example of a bi-directional distribution channel serving as supply distribution channel, according to some embodiments.

FIGS. 1-3 show a cooling system with a redundant fluid distribution channel for an IT rack, according to some embodiments. A cooling system for an information technology (IT) rack 100 is shown. An IT rack can have IT equipment such as IT equipment 132 and IT equipment 134 that are each housed in respective chassis that are shelved in the IT rack. An IT rack can typically have more shelves, however, for sake of simplicity, two IT equipment are shown. IT equipment can include computing devices such as servers and other computing devices that can use liquid cooling. Each chassis can have three fluid connections that each fluidly connects the chassis to a distribution port of each of the distribution channels.

The cooling system can include a first distribution channel 102, a second distribution channel 112, and a third distribution channel 122. Each of the distribution channels can have a main port (106, 116, 126) that connects to a fluid return line 142 or a fluid supply line 146, and one or more distribution ports (104, 108, 114, 118, 124, 128) that deliver fluid or receive fluid from IT equipment (132, 134) housed in the IT rack. The fluid supply line and fluid return line can be external to the IT rack, and integrated within the facility (e.g., in an IT room of a data center). Although not shown, in some examples, the facility can include a cooling system which can include fans, refrigerators, or chillers, that can transfer thermal energy to and from the fluid to manage temperature of the supply fluid.

One or more valves such as valves 119 and 120 can be arranged such that at least one of: the first distribution channel 102, the second distribution channel 112, and the third distribution channel 122 fluidly connects and disconnects with both the fluid return line 142 and the fluid supply line 146 through the one or more valves to provide at least one bi-directional distribution channel. In this example, FIG. 1 shows a representation of valves 119 and 120 that connect the fluid distribution channel 112 with the supply return line 142 and supply line 146, respectively.

A controller 130 can be communicatively coupled to control a state of the one or more valves (e.g., 119, 120). Each of the one or more valves can have an actuator (e.g., a solenoid, pneumatic actuator, or other actuator type) that can open or close each valve. The controller can provide an electric signal that causes the actuator to open or close a respective valve. As such, depending on the open and close state of the one or more valves such as valves 119 and 120, the bi-directional distribution channel (in this example, distribution channel 112) can serve as a supply distribution channel or a return distribution channel which can serve as a back-up to one of the remaining distribution channels 102 and 122 in case of a failure or maintenance to those remaining distribution channels.

For example, as shown in this example embodiment, the main port 106 of the first distribution channel is directly connected to the fluid return line 142. As such, the first distribution channel serves as a dedicated return distribution channel. The main port 126 of the third distribution channel 122 is directly connected to the fluid supply line 146. As such, the third distribution channel serves as a dedicated supply distribution channel. The main port 116 of the second distribution channel is connected to the one or more valves (119, 120) such that the second distribution channel fluidly connects to either the fluid return line or the fluid supply line through the one or more valves depending on the state of the one or more valves.

For example, valve 119 can be arranged between the fluid return line 142 and the main port 116 of the second distribution channel. Valve 120 can be arranged between the fluid supply line 146 and the main port 116 of the second distribution channel. An arrangement of a valve can be understood as a position of the valve relative to a path of the fluid, e.g., connected to conduit, hoses, or pipes, through which the fluid travels.

FIG. 2 shows an example of the second distribution channel acting as return distribution channel. As shown, if distribution channel 102 becomes inoperable or removed (e.g., due to failure, maintenance, or other reason), the controller can sense this through sensors 132. In response, the controller can command the one or more valves to fluidly connect the main port 116 of the second distribution channel to the fluid return line 142. As such, the second distribution channel 112 can serve as a return distribution channel in the absence of distribution unit 102. For example, valve 119 can be commanded to open, while valve 120 is simultaneously commanded to close.

It should be understood that a no command from the controller can be understood as a command to open or close, given that a valve can have a normally closed or normally open position when not being commanded. Further, it should be understood that additional pairs of valves can be arranged like valve 119 and valve 120 to connect any of the other distribution channels to the return line or the supply line in an alternating manner such that those distribution channels can serve as a return distribution channel or a supply distribution channel, but not both at the same time.

It should be understood that the one or more valves can be arranged in different manners to provide an alternating functionality of the fluid distribution channels. For example, valve pairs such as valve 119 and valve 120 that alternate the fluid connection to a respective distribution unit can be implemented with a three-way valve or 'Y' valve. Other arrangements of the valves can also be used without departing from the scope of the disclosure.

In some examples, sensors 132 can include one or more flow sensors (e.g., flow sensors 201, 202) that sense that a distribution channel is inoperable or removed by sensing the flow of the fluid between the fluid return line or the fluid supply line and a respective distribution channel. For example, a flow sensor 201 can sense that the fluid flow between the fluid return line and the first distribution channel 102 is below a threshold amount. Additionally, or alternatively, sensors 132 can include position sensors or switches that detect whether the port 106 is connected to a mating connector. In response, the controller can command valve 119 to be open and valve 120 to be closed, as discussed.

FIG. 3 shows an example of the second distribution channel acting as supply distribution channel. In this example, the controller can sense that third distribution channel 122 is offline, e.g., through flow sensor 202 and/or other sensors as discussed in other sections. In response, controller can command the one or more valves to fluidly connect the main port of the second distribution channel 112 to the fluid supply line. As such, FIG. 2 and FIG. 3 show examples of how a controller can command the one or more valves to operate in a first state such that the second distribution channel serves as a return distribution channel, or alternatively, in a second state, such that the second distribution channel serves are a supply distribution channel. In such a manner, an IT rack can have a redundant fluid distribution network thereby reducing downtime and improving reliability.

It should be understood that ports, valves, and channels, and lines can include conduit, pipes, hoses, reservoirs, connectors, or other hardware. Similarly, components such as ports, IT equipment, valves, and lines can be interconnected using a suitable selection of conduit, pipes, hoses, adaptors, and/or connectors. Ports such as a main port or a distribution port can be understood as fluid connectors, such as manual mating dripless connectors, blind mating dripless connectors, or other connectors. For example, a chassis that houses IT equipment can connect to a distribution port with a corresponding mating connector.

Further, although one example arrangement is shown in FIGS. 1-3, it should be understood that any of the three distribution channels can be connected to the one or more valves so that it can operate bi-directionally. In some aspects, two or more of the three distribution channels can be connected to a plurality of valves to operate bi-directionally. In some aspects, all three of the distribution channels can be connected to the plurality of valves to operate bi-directionally, for example, as shown in FIGS. 4-5.

Figure 4:
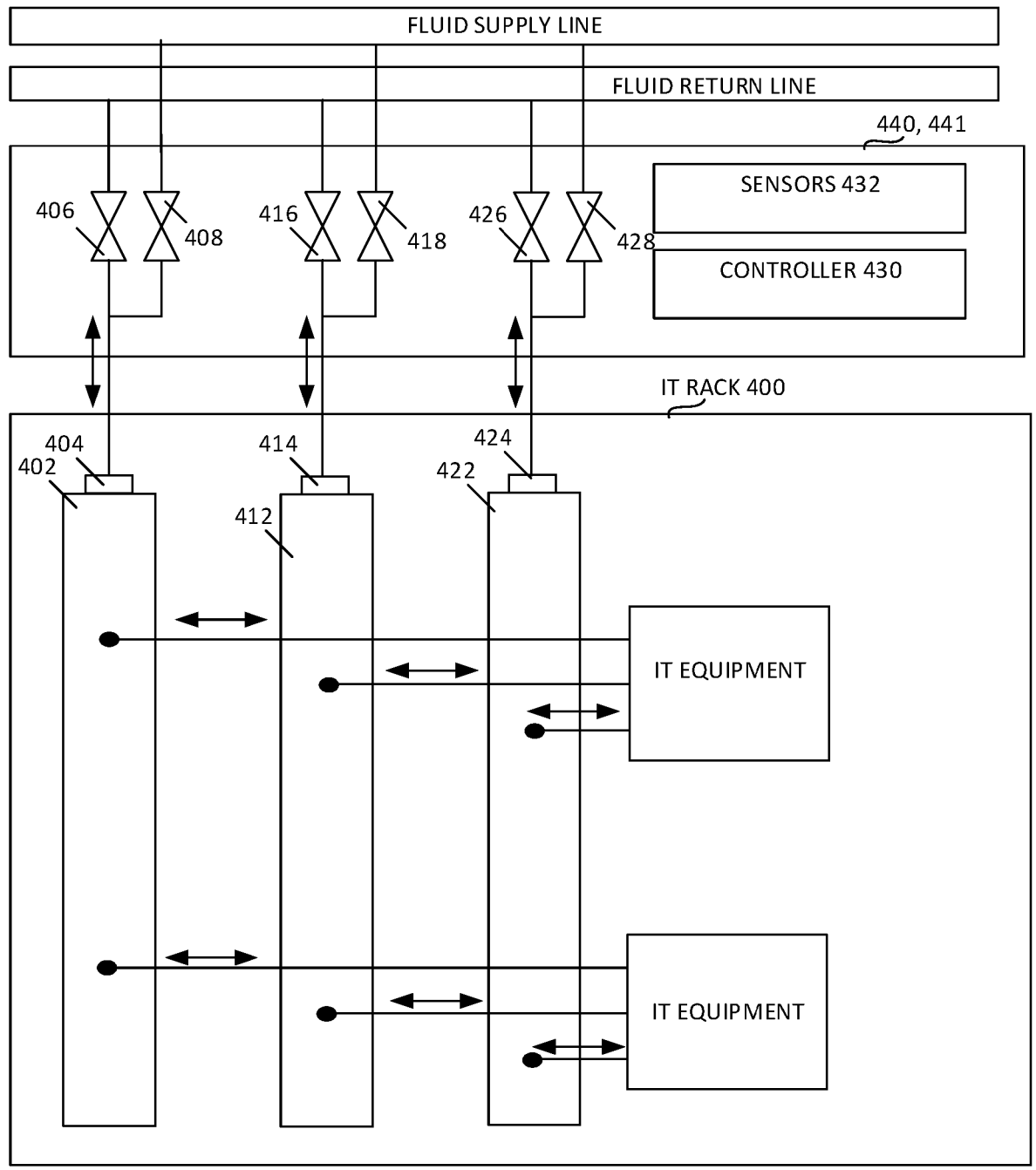
FIG. 4 shows a cooling system with redundant fluid distribution channels for an IT rack, according to some embodiments.
Figure 5:
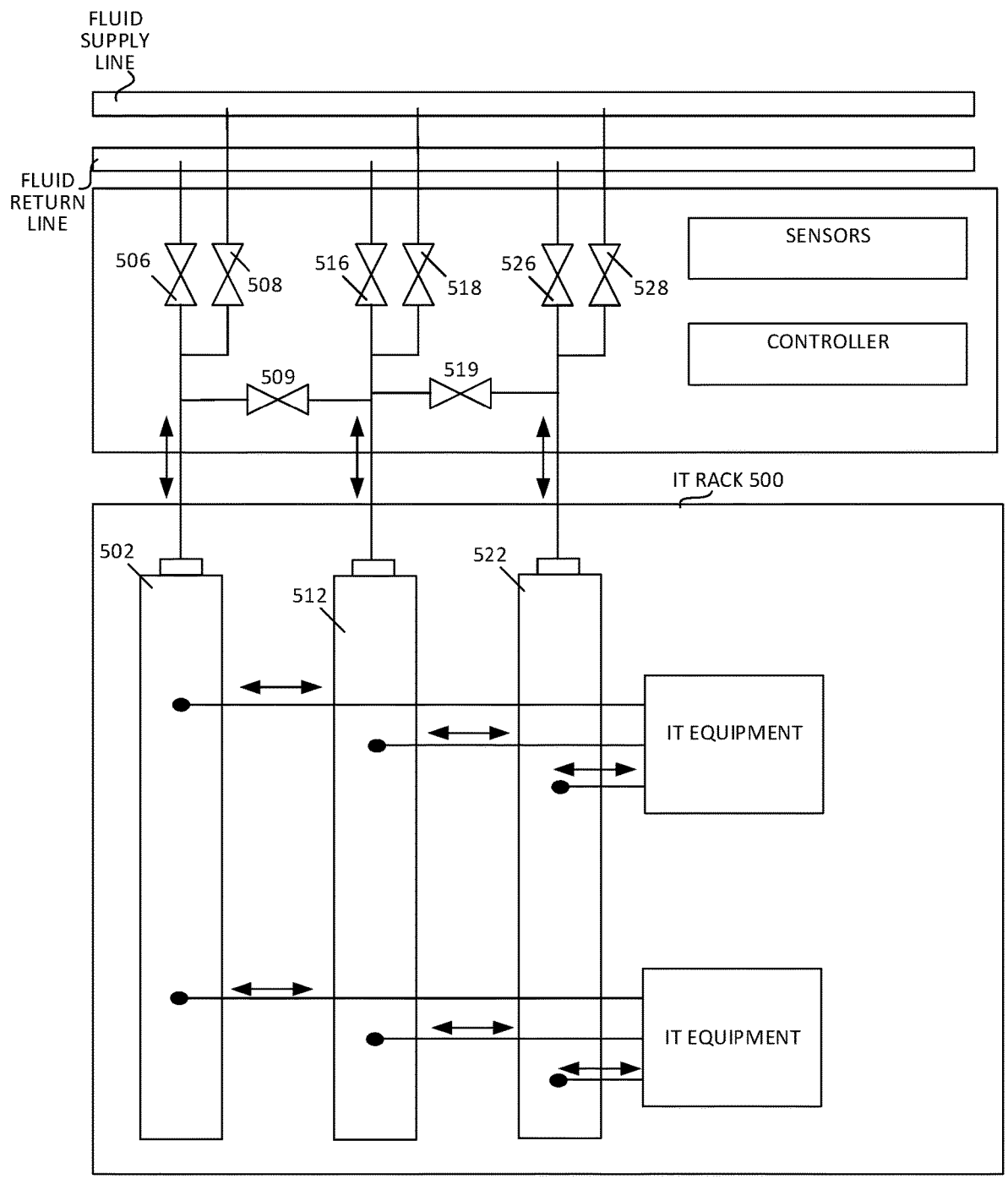
FIGS. 5-6 show a cooling system with redundant fluid distribution channels with additional redundancy, according to some embodiments.

FIG. 4 shows a cooling system with redundant fluid distribution channels for an IT rack, according to some embodiments. The one or more valves include a plurality of valves 406, 408, 416, 418, 426, and 428 that are arranged such that each of the first distribution channel 402, the second distribution channel 414, and the third distribution channel 424 fluidly connect and disconnects with both the fluid return line or the fluid supply line in an alternating manner, to provide three bi-directional distribution channels. In such an embodiment, the controller has additional flexibility regarding which role to assign to each distribution channel given that any of them can serve as a supply distribution channel or a return distribution channel.

In this example, valve 406 can be arranged between the fluid return line and the main port 404 of the first distribution channel. Valve 408 can be arranged between the fluid supply line and the main port 404 of the first distribution channel. As such, valve 406 and valve 408 can be a dedicated pair of valves connected to the first distribution channel that can alternate operation of the first distribution channel such that it serves as a) a supply distribution channel when valve 406 is closed and valve 408 is open, or b) a return distribution channel when valve 406 is open and valve 408 is closed.

Similarly, valve 416 can be arranged between the fluid return line and the main port 414 of the second distribution channel. Valve 418 can be arranged between the fluid supply line and the main port 414 of the second distribution channel. As such, valve 416 and valve 418 can be a dedicated pair of valves connected to the second distribution channel that can alternate operation of the second distribution channel such that it serves as a) a supply distribution channel when valve 416 is closed and valve 418 is open, or b) a return distribution channel when valve 416 is open and valve 418 is closed.

Similarly, valve 426 can be arranged between the fluid return line and the main port 424 of the third distribution channel. Valve 428 can be arranged between the fluid supply line and the main port 424 of the third distribution channel. As such, valve 426 and valve 428 can be a dedicated pair of valves connected to the third distribution channel that can alternate operation of the third distribution channel such that it serves as a) a supply distribution channel when valve 426 is closed and valve 428 is open, or b) a return distribution channel when valve 426 is open and valve 428 is closed. As discussed, three-way valves can be used to replace valve pairs in some embodiments.

In some embodiments, the controller can command the valves to a default state (e.g., under normal operations) such that any two of the distribution channels serve as supply distribution channels and one of the distribution channels serves as a return distribution channel. For example, the valves can have a default state that fluidly connects the first distribution channel 402 and the second distribution channel 412 to the fluid supply line, and the third distribution channel 422 to the fluid return line. In this manner, the supply side of the fluid circulation, having twice the supply capacity, is less likely to become a bottleneck for fluid distribution, which can improve operational efficiency.

In some embodiments, the controller can be configured to command the valves such that, under normal operation, one of the distribution channels (e.g., a designated 'back-up' distribution channel) is disconnected from the supply line and the return line while another of the distribution channels is connected to the fluid supply line and another is connected to the fluid return line. If the supply distribution channel or the return distribution channel becomes inoperative, then the back-up distribution channel can take its place. Normal operation can be understood as when all distribution channels are operative.

In some embodiments, the one or more valves, the one or more flow sensors, and/or the controller can be integrated in an assembly 440 which can be a standalone completely packaged module. For example, the components can be fixed to the assembly which can include plates, brackets, conduit, connectors, and other hardware. Additionally, or alternatively, at least one of the valves, sensors, and controller can be enclosed within a common housing 441. The assembly 440 or the common housing 441 can be external to the IT rack. This grouping of components, which can be understood as a fluid management unit, allows a flexible design within a data center that can house many IT racks. Fluid management units can be quickly installed and replaced. Different IT racks can be outfitted with a fluid management unit as-needed. Further, controllers can include programmable settings that determine the default state of the valves or the default designations of each distribution channel.

Figure 6:
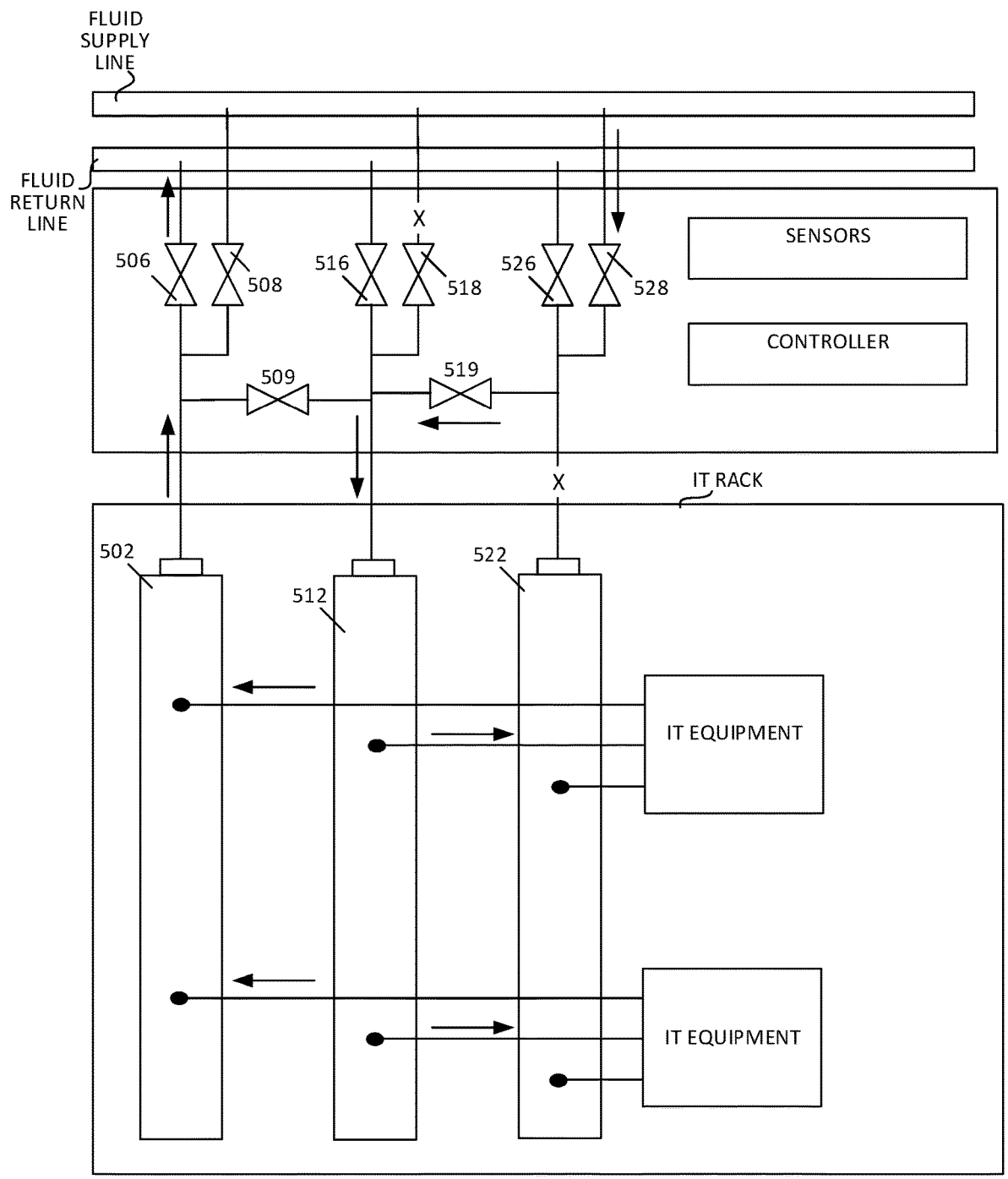

FIGS. 5-6 show a cooling system with redundant fluid distribution channels with additional redundancy, according to some embodiments. As previously described, one or more valves such as valves 506, 508, 516, 518, 526 and 528 can be commanded by the controller to change operation of one or more distribution channels (e.g., 502, 512, and 512). Further, one or more transfer valves (509, 519) can be arranged between the distribution channels.

For example, transfer valve 509 can be fluidly connected to a main port of the first distribution channel 502 and the main port of the second distribution channel 512. Similarly, transfer valve 519 can be fluidly connected to a main port of the first distribution channel 512 and the main port of the second distribution channel 522. These transfer valves can bypass operation of some of the valve pairs under some circumstances. The controller can command one of the transfer valves to an open state in response to a failure of the one or more valves. Otherwise, the transfer valves can have a closed state. The design enables more connections among the loops with additional fluid parts such as valves introduced. This may increase the feasibility of the solution and design, as well as increase the reliability. However, it needs to be mentioned that the additional fluid parts such as the valve may be considered as one additional failure port. Therefore, an optimized design requires an overall system balancing with many factors considered as whole, from case to case. The present disclosure provides the feature for designing rack fluid distribution with complete redundancy.

For example, in FIG. 6, distribution channel 522 has become inoperable. In response, the controller can command the valves to designate distribution channel 512 as a back-up supply distribution channel. In this example, however, valve 518, has also failed. In such a case, the controller can command the transfer valve 519 to an open state. Valve 528 can be open as well, so that distribution channel 512 can fluidly connect to the fluid supply line through valve 528. Thus, the transfer valves can effectively transfer a dedicated pair of valves from one distribution channel to another, which can provide additional redundancy, for example, in the case of a failed valve.

Figure 7:
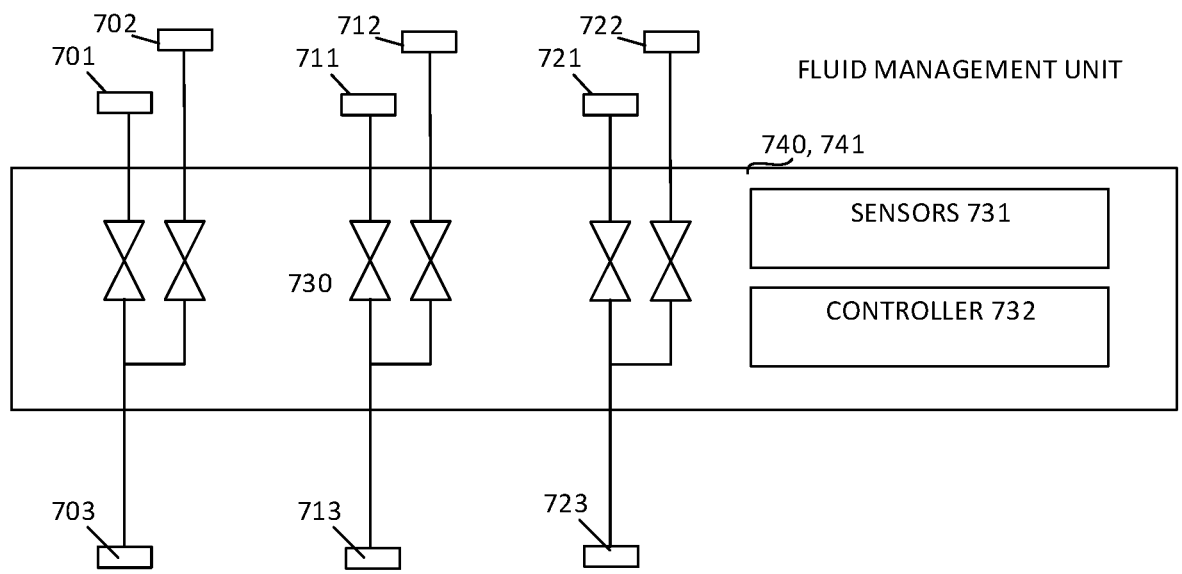
FIG. 7 shows an attachable and removable assembly that redundantly controls fluid flow to and from an IT rack, according to some embodiments.

FIG. 7 shows an attachable and removable assembly 740 that redundantly controls fluid flow to and from an IT rack, according to some embodiments. This design can be understood as a complete package module to be used for between the rack and facility loop. The assembly can be understood as a fluid management unit for managing the roles of each of the distribution channels, for example, to serve as a supply distribution channel or a return distribution channel. The assembly can be a stand-alone assembly that can be external to the IT rack.

The assembly can include one or more valves 730, which can be arranged as shown in this figure or as shown or described in other sections of the disclosure. The assembly can include sensors 731, which can include one or more flow sensors, position sensors, switches, and/or other sensors, as described. The assembly can also include a controller 732 that is communicatively coupled to the sensors and the valves.

The assembly can include one or more connectors (e.g., connectors 703, 713, 723) that connect to one or more fluid distribution channels. One or more pairs of connectors such as pair 701,702, pair 711,712, and pair 721,722 can have a first connector that connects to a fluid supply line and a second connector that connects to a fluid return line. In some aspects, the connectors can be manual mating dripless connectors, blind mating dripless connectors, or other connectors.

The fluid management system can include plates, brackets, conduit, connectors, a housing, mounts, and/or other hardware components that can be collectively understood as the assembly 740. Further, the fluid management system can include electrical and electronic components to power or communicate with the controller.

An IT rack can also be referred to as a server rack, an IT cabinet, or server cabinet. It can include a primary rack structure that stands vertically on a floor like a cabinet. An IT rack may contain IT equipment such as one or more servers which can be packaged as a server blade. Each server can have one or more processing units that can be attached to one or more liquid cold plates that receive fluid from the distribution channels as described herein. Any of the server blades can be assembled to a chassis with attached IT equipment (e.g., main PCB, peripheral devices, PCI-E devices, etc.). The chassis, which can be populated to the IT rack, can contain connectors and fluid channels. Each chassis can circulate fluid to and from the cold plates that are thermally connected to the IT equipment in the chassis. Further, each chassis can three fluid connections that fluidly connect the chassis to distribution ports of the distribution channels.

Server blades can be inserted into an array of server slots respectively from a frontend or a backend of an IT rack. Each of server blades may include one or more IT components (e.g., central processing units or CPUs, graphical processing units (GPUs), memory, and/or storage devices). Each IT component may perform data processing tasks, where the IT component may include software installed in a storage device, loaded into the memory, and executed by one or more processors to perform the data processing tasks. At least some of these IT components may be attached to the bottom of any of the cooling devices as described above. Server blades 903 may include a host server (referred to as a host node) coupled to one or more compute servers (also referred to as computing nodes, such as CPU server and GPU server).

The host server (having one or more CPUs) typically interfaces with clients over a network (e.g., Internet) to receive a request fora particular service such as storage services (e.g., cloud-based storage services such as backup and/or restoration), executing an application to perform certain operations (e.g., image processing, deep data learning algorithms or modeling, etc., as a part of a software-as-a-service or SaaS platform). In response to the request, the host server distributes the tasks to one or more of the performance computing nodes or compute servers (having one or more GPUs) managed by the host server. The performance compute servers perform the actual tasks, which may generate heat during the operations.

Some or all of the IT components of servers 903 may be attached to a variety of cooling devices, either via air cooling using a heatsink or via liquid cooling using a cold plate. One server may utilize air cooling while another server may utilize liquid cooling. Alternatively, one IT component of a server may utilize air cooling while another IT component of the same server may utilize liquid cooling. Liquid cooled IT equipment can have one or more cold plates attached to electronic components of the IT equipment, there by transferring thermal energy between the IT equipment and the fluid.

Some embodiments may include a non-transitory machine-readable medium (such as microelectronic memory) having stored thereon instructions, which program one or more data processing components (generically referred to here as a "processor") to perform operations described herein. In some embodiments, some of these operations might be performed by specific hardware components that contain hardwired logic. Those operations might alternatively be performed by any combination of programmed data processing components and fixed hardwired circuit components.

For example, a controller can include a processor that performs instructions stored in memory to operate one or more valves according to the instructions. The instructions can include processing logic that changes the valve states based on sensor information and/or settings. Additionally, or alternatively, the processing logic can be programmed into electronic hardware components (e.g., field programmable gate arrays, complex programmable logic device, or other programmable semi-conductor based component).

In the foregoing specification, embodiments of the disclosure have been described with reference to specific exemplary embodiments thereof. It will be evident that various modifications may be made thereto without departing from the broader spirit and scope of the disclosure as set forth in the following claims. The specification and drawings are, accordingly, to be regarded in an illustrative sense rather than a restrictive sense.

While certain aspects have been described and shown in the accompanying drawings, it into be understood that such aspects are merely illustrative of and not restrictive on the broad disclosure, and that the disclosure is not limited to the specific constructions and arrangements shown and described, since various other modifications may occur to those of ordinary skill in the art. The description is thus to be regarded as illustrative instead of limiting.

In some aspects, this disclosure may include the language, for example, "at least one of [element A] and [element B]." This language may refer to one or more of the elements. For example, "at least one of A and B" may refer to "A," "B," or "A and B." Specifically, "at least one of A and B" may refer to "at least one of A and at least one of B," or "at least of either A or B." In some aspects, this disclosure may include the language, for example, "[element A], [element B], and/or [element C]." This language may refer to either of the elements or any combination thereof. For instance, "A, B, and/or C" may refer to "A," "B," "C," "A and B," "A and C," "B and C," or "A, B, and C."

What is claimed is:

1. A cooling system for an information technology (IT) rack, comprising:
    a first distribution channel, a second distribution channel, and a third distribution channel, each having a main port that connects to a fluid return line or a fluid supply line, and one or more distribution ports that deliver fluid or receive fluid from IT equipment housed in the IT rack;
    one or more valves arranged such that at least one of: the first distribution channel, the second distribution channel, and the third distribution channel fluidly connects and disconnects with both the fluid return line and the fluid supply line through the one or more valves to provide at least one bi-directional distribution channel; and
    a controller that is communicatively coupled to the one or more valves, and the controller is configured to control a state of the one or more valves including to command the one or more valves to fluidly connect the main port of the second distribution channel to the fluid return line in response to a reduced flow of fluid through the first distribution channel.

2. The cooling system of claim 1, wherein
    the main port of the first distribution channel is directly connected to the fluid return line;
    the main port of the third distribution channel is directly connected to the fluid supply line; and
    the main port of the second distribution channel is connected to the one or more valves such that the second distribution channel fluidly connects to either the fluid return line or the fluid supply line through the one or more valves depending on the state of the one or more valves.

3. The cooling system of claim 1, wherein the one ore more valves includes a first valve arranged between the fluid return line and the main port of the second distribution channel and a second valve arranged between the fluid supply line and the main port of the second distribution channel.

4. The cooling system of claim 2, wherein the controller is configured to command the one or more valves to fluidly connect the main port of the second distribution channel to the fluid supply line in response to a reduced flow of fluid through the third distribution channel.

5. The cooling system of claim 1, wherein the one or more valves have a default state that fluidly connects the first distribution channel and the second distribution channel to the fluid supply line, and the third distribution channel to the fluid return line.

6. The cooling system of claim 1, wherein the one or more valves are arranged such that each of the first distribution channel, the second distribution channel, and the third distribution channel fluidly connect and disconnects with both the fluid return line and the fluid supply line through the one or more valves to provide three bi-directional distribution channels.

7. The cooling system of claim 1, wherein the one or more valves includes a transfer valve that is arranged between the main port of the first distribution channel and the main port of the second distribution channel, and the controller is configured to command the at least one transfer valve to an open state in response to a failure of the one or more valves.

8. The cooling system of claim 1, further comprising one or more flow sensors that are arranged to sense fluid flow through the main port of at least one of the first distribution channel, the second distribution channel, and the third distribution channel.

9. The cooling system of claim 8, wherein the controller, the one or more valves, and the one or more flow sensors are fixed to an assembly or enclosed within a common housing, as a complete packaged module.

10. The cooling system of claim 9, wherein the complete packaged module is external to the IT rack.

11. An information technology (IT) rack, comprising:
    a plurality of IT equipment; and
    a cooling system, including:
        a first distribution channel, a second distribution channel, and a third distribution channel, each having a main port that connects to a fluid return line or a fluid supply line, and one or more distribution ports that deliver fluid or receive fluid from the IT equipment housed in the IT rack,
        one or more valves arranged such that at least one of: the first distribution channel, the second distribution channel, and the third distribution channel fluidly connects and disconnects with both the fluid return line and the fluid supply line through the one or more valves to provide at least one bi-directional distribution channel, and
        a controller that is communicatively coupled to the one or more valves, and the controller is configured to command the one or more valves to fluidly connect the main port of the second distribution channel to the fluid supply line in response to a reduced flow of fluid through the third distribution channel.

12. The IT rack of claim 11, wherein
    the main port of the first distribution channel is directly connected to the fluid return line;
    the main port of the third distribution channel is directly connected to the fluid supply line; and
    the main port of the second distribution channel is connected to the one or more valves such that the second distribution channel fluidly connects and disconnects with both the fluid return line and the fluid supply line through the one or more valves depending on a state of the one or more valves.

13. The IT rack of claim 12, wherein the controller is configured to command the one or more valves to fluidly connect the main port of the second distribution channel to the fluid return line in response to a reduced flow of fluid through the first distribution channel.

14. The IT rack of claim 11, wherein the one or more valves includes a first valve arranged between the fluid return line and the main port of the second distribution channel and a second valve arranged the fluid supply line and the main port of the second distribution channel.

15. The IT rack of claim 11, wherein the one or more valves have a default state that fluidly connects the first distribution channel and the second distribution channel to the fluid supply line, and the third distribution channel to the fluid return line.

16. The IT rack of claim 11, wherein the one or more valves are arranged such that each of the first distribution channel, the second distribution channel, and the third distribution channel fluidly connect and disconnects with both the fluid return line and the fluid supply line through the one or more valves to provide three bi-directional distribution channels.

17. The IT rack of claim 11, wherein the one or more valves includes a transfer valve that is arranged between the main port of the first distribution channel and the main port of the second distribution channel, and the controller is configured to command the at least one transfer valve to an open state in response to a failure of the one or more valves.

18. The IT rack of claim 11, wherein one or more flow sensors are arranged to sense fluid flow through the main port of at least one of the first distribution channel, the second distribution channel, and the third distribution channel.

19. The IT rack of claim 18, wherein the controller, the one or more valves, and the one or more flow sensors are fixed to an assembly or enclosed within a common housing, as a complete packaged module.

20. A data center system, comprising:
a fluid supply line to receive fluid from a fluid source;
a fluid return line to return the fluid to the fluid source; and
a plurality of information technology (IT) racks, wherein each of the IT racks is connected with a cooling system, the cooling system including:
a first distribution channel, a second distribution channel, and a third distribution channel, each having a main port that connects to the fluid return line or the fluid supply line, and one or more distribution ports that deliver fluid or receive fluid from IT equipment housed in the IT rack,
one or more valves arranged such that at least one of: the first distribution channel, the second distribution channel, and the third distribution channel fluidly connects and disconnects with both the fluid return line and the fluid supply line through the one or more valves to provide at least one bi-directional distribution channel, and
a controller that is communicatively coupled to the one or more valves, and the controller is configured to control a state of the one or more valves including to command the one or more valves to fluidly connect the main port of the second distribution channel to the fluid return line in response to a reduced flow of fluid through the first distribution channel.

* * * * *